(12) United States Patent
Ide et al.

(10) Patent No.: US 6,566,959 B2
(45) Date of Patent: May 20, 2003

(54) AMPLIFIER CIRCUIT HAVING A PARTICULAR BIASING ARRANGEMENT

(75) Inventors: Satoshi Ide, Kawasaki (JP); Norio Ueno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/010,438

(22) Filed: Nov. 8, 2001

(65) Prior Publication Data
US 2002/0163386 A1 Nov. 7, 2002

(30) Foreign Application Priority Data
Mar. 14, 2001 (JP) .......................... 2001-072332

(51) Int. Cl.$^7$ .................................. H03F 3/04
(52) U.S. Cl. ........................ 330/296; 330/288
(58) Field of Search ............................ 330/288, 296

(56) References Cited

U.S. PATENT DOCUMENTS

| | | | | |
|---|---|---|---|---|
| 3,573,645 A | * | 4/1971 | Wheatley, Jr. | 330/288 |
| 4,800,339 A | * | 1/1989 | Tanimoto et al. | 330/253 |
| 5,812,029 A | * | 9/1998 | Prentice | 330/288 |

* cited by examiner

*Primary Examiner*—Robert Pascal
*Assistant Examiner*—Khanh Van Nguyen
(74) *Attorney, Agent, or Firm*—Katten Muchin Zavis Rosenman

(57) ABSTRACT

In an amplifying circuit composed of a basic amplifier and a bias circuit thereof, a drive transistor drives a load transistor, and a reference current source biases a drive-side and a load-side supporting bias transistors with a constant current for generating a bias voltage of the load transistor. Also, a load resistor or a drive-side common-gate transistor is inserted between the drive transistor and the load transistor. Also, a load-side common-gate transistor is inserted between the load transistor and a power supply. In addition, the bulks and sources of the load transistor and the load-side supporting bias transistor are short-circuited.

19 Claims, 12 Drawing Sheets

FIG.2B $g_m$ CHARACTERISTIC OF MOS-FET

FIG.5B CHARACTERISTICS OF ENHANCEMENT-MODE FET & DEPLETION-MODE FET

PRIOR ART

AMPLIFIER CIRCUIT HAVING A PARTICULAR BIASING ARRANGEMENT

BACKGROUND OF THE INVENTION

1. Field of the Invention

The present invention relates to an amplifying circuit, and in particular to an amplifying circuit composed of a basic amplifier and a bias circuit thereof.

In recent years, a MOS semiconductor IC (integrated circuit) technology has remarkably developed, so that the scale of integration and the performance have been improved. This technology is applied to not only a high-performance digital IC but also a high-performance analog IC. For example, an analog-digital hybrid IC by the MOS semiconductor IC technology can realize digital and analog circuits on a single chip by a CMOS process, and is economically advantageous.

In order to apply a CMOS semiconductor IC technology to such a high-performance analog IC, it is important to realize a high-performance analog amplifying circuit using an MOS transistor.

2. Description of the Related Art

FIG. 18 shows an arrangement of a prior art transimpedance type amplifying circuit 100, which is composed of an inversion amplifying circuit 10 where three-staged basic amplifiers (hereinafter, occasionally abbreviated as amplifiers) 11–13 are connected in cascade, and a feedback resistor $R_F$, hereinafter occasionally indicating the resistance value of the resistor $R_F$, connecting between an input terminal IN and an output terminal OUT of the inversion amplifying circuit 10.

The amplifiers 11–13 are respectively composed of common-source MOS transistors M11, M21, and M31, and load resistors $R_1$, $R_2$, and $R_3$ connected in series to the drains of the MOS transistors M11, M21, and M31.

In the absence of a signal inputted to the input terminal IN, a current does not flow through the feedback resistor $R_F$, so that a bias voltage of the amplifying circuit 100 becomes the same as a bias voltage $V_0$ of the output terminal OUT without any voltage drop being generated at the feedback resistor $R_F$.

It is to be noted that the inversion amplifying circuit 10 shown in FIG. 18 is composed of three basic amplifiers, while an inversion amplifying circuit is generally composed of an odd number of basic amplifiers.

The open loop gain $A_1$ of the amplifier 11 can be expressed by the following equation (1):

$$A_1 = g_{m1} * R_1 \qquad \text{Eq.(1)}$$

where $g_{m1}$ is the transconductance of the MOS transistor M11, which can be expressed by the following equation (2):

$$g_{m1} = \sqrt{2 * \mu_N * C_{OX} * \frac{W_{11}}{L_{11}} * I_1} \qquad \text{Eq. (2)}$$

where $\mu_N$, $C_{OX}$, $W_{11}$, $L_{11}$, and $I_1$ are respectively the electron mobility, the gate metal oxide capacitance, the channel width, the channel length, and the reference current of the MOS transistor M11.

Similarly, the gains $A_2$ and $A_3$ of the amplifiers 12 and 13, and the transconductances $g_{m2}$ and $g_{m3}$ of the MOS transistors M21 and M31 can be respectively expressed by the following equations (3)–(6):

$$A_2 = g_{m2} * R_2 \qquad \text{Eq.(3)}$$

$$A_3 = g_{m3} * R_3 \qquad \text{Eq.(4)}$$

$$g_{m2} = \sqrt{2 * \mu_N * C_{OX} * \frac{W_{21}}{L_{21}} * I_2} \qquad \text{Eq. (5)}$$

$$g_{m3} = \sqrt{2 * \mu_N * C_{OX} * \frac{W_{31}}{L_{31}} * I_3} \qquad \text{Eq. (6)}$$

where $W_{21}$, $L_{21}$, $I_2$, and $W_{31}$, $L_{31}$, $I_3$ are respectively the channel widths, the channel lengths, and the reference currents of the MOS transistors M21 and M31.

The open loop gain A of the inversion amplifying circuit 10 can be expressed by the following equation (7):

$$A = A_1 * A_2 * A_3 \qquad \text{Eq.(7)}$$

Since the transconductances $g_{m1}$–$g_{m3}$ vary depending on a process variable condition and a temperature, and the load resistances $R_1$–$R_3$ also vary independently of the transconductances, the gains $A_1$, $A_2$, and $A_3$ of the amplifiers 11–13 vary extensively.

In case the MOS transistors M21 and M31 and the load resistances $R_2$ and $R_3$ are respectively the same as the MOS transistor M11 and the load resistance $R_1$ for example, the open loop gain A of the inversion amplifying circuit 10 can be expressed by the following equation (8):

$$A = A_1^3 \qquad \text{Eq.(8)}$$

Accordingly, the open loop gain A of the inversion amplifying circuit 10 in this case varies with the cubic of the variation of the gain $A_1$.

FIG. 19 shows an arrangement of a general preamplifying circuit for an optical receiver using the amplifying circuit 100 shown in FIG. 18. This preamplifying circuit is composed of the amplifying circuit 100, a photo diode PD and an input capacitance $C_{IN}$ connected to the input terminal IN of the amplifying circuit 100. It is to be noted that the input capacitance $C_{IN}$ includes the junction capacitance of the photo diode PD and the input capacitance of the inversion amplifying circuit 10.

In the optical preamplifying circuit, a noise increases when a bandwidth is too wide, while an intersymbol interference caused by a waveform deterioration occurs when the bandwidth is too narrow. Therefore, an allowable range of a cutoff frequency which determines the optimal bandwidth is very narrow. Generally, the optimal range of the cutoff frequency is regarded as 0.6–1.0 times a transmission data rate B.

A close loop bandwidth of the preamplifying circuit will now be obtained. A faint current signal $I_{IN}$ from the photo diode PD inputted from the input terminal IN is divided into the input capacitance $C_{IN}$ and the feedback resistor $R_F$ with the values of currents $I_C$ and $I_R$. Accordingly, circuit equations of the preamplifying circuit are expressed by the following equations (9)–(12):

$$I_{IN} = I_C + I_R \qquad \text{Eq.(9)}$$

$$V_{OUT} - V_0 = -A * (V_{IN} - V_0) \qquad \text{Eq.(10)}$$

$$V_{IN} - V_{OUT} = R_F * I_R \qquad \text{Eq.(11)}$$

$$V_{IN} - V_0 = \frac{1}{j*(2\pi*f)*C_{IN}} * I_C \qquad \text{Eq. (12)}$$

where f and $V_0$ are respectively a frequency and the above-mentioned bias voltage.

If $I_C$, $I_R$, and $V_{IN}$ are eliminated from Eqs.(9)–(12) to obtain the relationship between an input current $I_{IN}$ and an output voltage $V_{OUT}$, the following equation (13) is held:

$$V_{OUT} = -\frac{A}{1 + A + j*(2\pi*f)*R_F*C_{IN}} * R_F * I_{IN} + V_0 \qquad \text{Eq. (13)}$$

In case the open loop gain A of the inversion amplifying circuit 10>>1, the denominator "1" of Eq.(13) can be neglected. Accordingly, a trans-impedance $Z_T$ assumes the following equation (14) that is Eq.(13) differentiated by the current $I_{IN}$. When the frequency f=0, a trans-impedance $Z_{T0}$ assumes the following equation (15), and a bandwidth $f_{3dB}$ assumes an equation (16) from $(|Z_T|/Z_{T0}|)^2 = \frac{1}{2}$.

$$Z_T = \frac{dV_{OUT}}{dI_{IN}} = \frac{-1}{1 + j * \frac{2\pi * R_F * C_{IN}}{A} * f} * R_F \qquad \text{Eq. (14)}$$

$$Z_{T0} = -R_F \qquad \text{Eq.(15)}$$

$$f_{-3\,dB} = \frac{A}{2\pi * R_F * C_{IN}} \qquad \text{Eq. (16)}$$

In case the open loop gain A>>1, Eq.(16) indicates that the close loop bandwidth of the preamplifying circuit is determined only by the open loop gain A of the inversion amplifying circuit 10, the input capacitance $C_{IN}$, and the feedback resistance $R_F$. For the above-mentioned input capacitance $C_{IN}$ and the feedback resistance $R_F$, sufficiently stable values can be designed. However, since the open loop gain A in the amplifier of the MOS transistor extensively varies as mentioned above, it is difficult to confine the bandwidth of the preamplifying circuit into the optimal bandwidth, 0.6–1.0 times a transmission data rate B.

SUMMARY OF THE INVENTION

It is accordingly an object of the present invention to provide an amplifying circuit comprising a basic amplifier and a bias circuit thereof, and having a gain A stable against variations of process condition and temperature.

As mentioned above, a variation of gain in the amplifying circuit is caused by a transconductance of a transistor generated on a substrate and a load resistance varied with variations of process condition and temperature. Accordingly, if the basic amplifier and the bias circuit can be composed in the form of canceling a variable electron mobility $\mu_N$, a gate metal oxide capacitance $C_{OX}$, and the like by the process shown in Eq.(2), the above-mentioned object can be achieved.

As shown in a principle (1) of the present invention in FIG. 1, an amplifying circuit according to the present invention comprises: an amplifier 11 including a drive transistor M11 and a load transistor M12 driven by the drive transistor M11, and a basic bias circuit 21 composed of a series circuit of a drive-side supporting bias transistor M01 having a gate-drain short-circuited, a load-side supporting bias transistor M02 having a gate-drain short-circuited for outputting a bias voltage of the load transistor M12 from a drain, and a reference current source IREF1 for biasing the drive-side and the load-side supporting bias transistors M01 and M02 with a constant current $I_1$ (claim 1).

It is to be noted that while the transistors M11, M12, M01, and M02 in FIG. 1 are an n-channel-type, p-channel type transistors can be similarly applied. Hereinafter, the n-channel transistors will be described unless specified to the contrary. Channel lengths $L_{11}$, $L_{12}$, $L_{01}$, $L_{02}$, and channel widths $W_{11}$, $W_{12}$, $W_{01}$, and $W_{02}$ of the transistors M11, M12, M01, and M02 are correspondingly set so that $L_{11} = L_{01}$, $L_{12} = L_{02}$, $W_{11} = n_1 * W_{01}$, and $W_{12} = n_1 * W_{02}$.

When a feedback resistor $R_F$ is connected between an input terminal and an output terminal upon such a setting, the gate-source voltage $V_0$ of the transistor M11 becomes almost equal to the gate-source voltage $V_{GS01}$ of the bias transistor M01. A bias current of the amplifier 11 assumes $n_1 * I_1$ which is $n_1$ times the constant current $I_1$ of the reference current source IREF1.

Also, the transconductances $g_{m11}$ and $g_{m21}$ of the transistors M11 and M21 can be respectively expressed by the following equations (17) and (18):

$$g_{m11} = \sqrt{2 * \mu_N * C_{OX} * \frac{W_{11}}{L_{11}} * n_1 * I_1} \qquad \text{Eq. (17)}$$

$$g_{m12} = \sqrt{2 * \mu_N * C_{OX} * \frac{W_{12}}{L_{12}} * n_1 * I_1} \qquad \text{Eq. (18)}$$

Accordingly, the gain $A_1$ of the amplifier 11 can be expressed by the following equation (19):

$$A_1 = \frac{g_{m11}}{g_{m12}} = \sqrt{\frac{W_{11} * L_{12}}{W_{12} * L_{11}}} \qquad \text{Eq. (19)}$$

Namely, the gain $A_1$ becomes irrelevant to $\mu_N$ and $C_{OX}$ whose variations are extensive. Furthermore, if the channel length $L_{11}$ is assumed to be the channel length $L_{12}$ (accordingly, the channel length $L_{01}$=the channel length $L_{02}$, the gain $A_1$ can be expressed by the following equation (20):

$$A_1 = \sqrt{\frac{W_{11}}{W_{112}}} \qquad \text{Eq. (20)}$$

According to Eq.(20), the gain $A_1$ can be expressed only by the channel widths $W_{11}$ and $W_{12}$ of the transistors M11 and M12.

In case the transistors M11, M12, M01, and M02 are integrated on the same substrate, the above-mentioned conditions of the channel lengths and the channel widths are easily satisfied.

Namely, for the load of the amplifier 11, by using the transconductance $g_{m12}$ of the load transistor M12 having the same variation factor as the transconductance $g_{m11}$ of the drive transistor M11, the variation of the transconductance is canceled, thereby realizing a stable amplifying gain $A_1$ independent of the variations of process condition and temperature.

Also, the relationships between the bias transistor M01 and the drive transistor M11, and between the bias transistor M02 and the load transistor M12 are set by the channel length or the channel width, thereby enabling the characteristic of the amplifier to be easily determined. Furthermore, by making the transistors M01, M02, M11, and M12 on the same substrate, the amplifying circuit becomes stable for the temperature variation.

Also, the present invention, as shown in a principle (2) of the present invention in FIG. 2A, may further comprise a load resistor $R_1$ inserted between the drive and the load transistors M11 and M12, and a bias resistor $R_0$ inserted between the drive-side and the load-side supporting bias transistors M01 and M02 (claim 2).

Namely, as shown in FIG. 2B, a transconductance $g_m$ increases in proportion to $(V_{GS}-V_T)$ in a normal area Z2, while the transconductance $g_m$ has a characteristic of being saturated from a certain constant value (see strong inversion area Z3). Accordingly, there is a problem that the transconductance $g_{m12}$ of the load transistor M12 is saturated and fails to follow Eq.(20) if the channel width ratio $W_{11}/W_{12}$ of the drive transistor M11 and the load transistor M12 is increased in order to increase the gain.

In order to solve this problem, the load resistor $R_1$ is added. The gain $A_1$ in this case can be expressed by the following equation (21):

$$A_1 = g_{m11} * \left(\frac{1}{g_{m12}} + R_1\right) = \sqrt{\frac{W_{11}}{W_{12}}} + g_{m11} * R_1 \qquad \text{Eq. (21)}$$

According to Eq.(21), it is possible to improve the gain $A_1$ by the load resistor $R_1$ by using the transconductance $g_m$ within the normal area (see FIG. 2B) with the ratio of the channel width being suppressed within a constant range. Namely, although the second term of Eq.(21) is the same as Eq.(1) of the prior art gain $A_1$, it is possible to suppress the gain variation caused by the resistor $R_1$ comparatively small if the gain by the first term is made larger than the gain by the second term, thereby enabling the whole variation of the gain $A_1$ to be suppressed within a range without problems.

Also, the present invention, as shown in FIG. 3, may further comprise a drive-side common-gate transistor M14 inserted between the drive and the load transistors M11 and M12, and a drive-side common-gate bias circuit 22b for providing a bias voltage to a gate of the drive-side common-gate transistor M14 (claim 3).

Generally, a parasitic capacitance between terminals of a transistor must be considered when a high frequency signal is treated. In the drive transistor M11, there is a gate-drain capacitance in addition to a gate-source capacitance (see capacitance $C_{IN}$ in FIG. 19). The gate-drain capacitance looks larger due to the Miller effect when observed from the input side, which causes a decrease of frequency bandwidth.

In order to avoid the Miller effect problem, load impedance of the drive transistor M11 has to be decreased without greatly changing a drain electric potential of the drive transistor M11. Thus, it becomes possible to realize a broad bandwidth by inserting the drive-side common-gate transistor M14 whose input impedance is low between the drive transistor M11 and the load transistor M12 and by decreasing the influence of the Miller effect.

It is to be noted that since the current gain of the common-gate transistor M14=1, the drain current $I_1$ of the drive transistor M11 becomes equal to the drain current of the load transistor M12. Also, the output terminal of the amplifier 11 in this case is the drain terminal of the common-gate transistor M14.

Also, the drive-side common-gate bias circuit 22b may be composed of a bias transistor M05 having a gate-drain short-circuited for outputting the bias voltage from a drain, and a reference current source IREF2 for biasing the bias transistor M05 with a constant current (claim 4).

Also, the present invention, as shown in a principle (4) of the present invention in FIG. 4, may further comprise a load-side common-gate transistor M13 connected between the load transistor M12 and a power supply, and a load-side common-gate bias circuit 22c for providing a bias voltage to a gate of the load-side common-gate transistor M13 (claim 5).

Also, the above-mentioned load-side common-gate bias circuit 22c may be composed of a series circuit of a drive-side supporting bias transistor M05 having a gate-drain short-circuited, a load-side supporting bias transistor M06 having a gate-drain short-circuited for outputting the bias voltage from a drain, and a reference current source IREF2 for biasing the drive-side and the load-side supporting bias transistors M05 and M06 with a constant current (claim 6).

Generally, there is a variation in a power supply voltage varying the drain-source voltage of a load transistor, so that a characteristic of an amplifier varies. The common-gate transistor M13 is inserted in order to decrease the characteristic variation by the power supply voltage variation.

Hereinafter, conditions for generating the bias voltage of the load-side common-gate transistor M13 by the above-mentioned bias circuit 22c will be described. The square law of Eq.(22) is held between the drain current $I_1$ and a gate-source voltage $V_{GS}$ of the transistor M02. From Eq. (22), the following equation (23) can be led:

$$I_D = \frac{\mu_N * C_{OX}}{2} * \frac{W}{L} * (V_{GS} - V_T)^2 \qquad \text{Eq. (22)}$$

$$V_{GS} - V_T = \sqrt{\frac{2}{\mu_N * C_{OX}} * \frac{L}{W} * I_D} \qquad \text{Eq. (23)}$$

Also, in order that the transistor M02 operates in the saturated area, the following equation (24) has to be held:

$$V_{DS} \geq V_{GS} - V_T = \sqrt{\frac{2}{\mu_N * C_{OX}} * \frac{L}{W} * I_D} \qquad \text{Eq. (24)}$$

If the gate-source voltages of the transistors M01, M02, M03, M05, and M06 are respectively assumed to be $V_{GS01}$, $V_{GS02}$, $V_{GS03}$, $V_{GS05}$, and $V_{GS06}$, the following equation (25) is held:

$$V_{DS02} = (V_{GS05} + V_{GS06}) - V_{GS03} - V_{GS01} \qquad \text{Eq.(25)}$$

In case $V_{GS05} = V_{GS01}$, the following equation (26) is held:

$$V_{DS02} = V_{GS06} - V_{GS03} \qquad \text{Eq. (26)}$$

$$= \sqrt{\frac{2}{\mu_N * C_{OX}} * \frac{L_{06}}{W_{06}} * I_1} -$$

$$\sqrt{\frac{2}{\mu_N * C_{OX}} * \frac{L_{03}}{W_{03}} * I_1}$$

-continued $$\geq \sqrt{\frac{2}{\mu_N * C_{OX}} * \frac{L_{02}}{W_{02}} * I_1}$$

From Eq.(26), the following equation (27) can be led:

$$\sqrt{\frac{L_{06}}{W_{06}}} \geq \sqrt{\frac{L_{02}}{W_{02}}} + \sqrt{\frac{L_{03}}{W_{03}}} \qquad \text{Eq. (27)}$$

In case the relationships between the channel lengths and the channel widths of the transistors M02 and M03 are such that the channel length $L_{03}$=the channel length $L_{02}$ and the channel width $W_{03}$=the channel width $W_{02}$, the following equation (28) is held:

$$\frac{L_{06}}{W_{06}} \geq 4 * \frac{L_{02}}{W_{02}} \qquad \text{Eq. (28)}$$

Namely, in order that the bias circuit 22 of the load-side common-gate transistor M13 generates such a bias voltage that the load transistor M12 operates in the saturated area, it should be rendered that a channel width $W_{05}$=the channel width $W_{01}$, and the channel width $W_{06}$=the channel width $W_{02}/4$ when the sizes of e.g. the transistors M12 and M13 are equal. Thus, it becomes possible to decrease the influence of the power supply voltage variation and to realize a more stable gain characteristic.

Also, the basic bias circuit 21c may have a common-gate supporting bias transistor M03 inserted between the load-side supporting bias transistor M02 and the reference current source IREF1 within its own circuit, and which inputs the bias voltage of the load-side common-gate bias circuit 22 to a gate (claim 7).

Also, the common-gate transistors M13 and M03 of the basic amplifier 11c and the basic bias circuit 21c may respectively have threshold voltages for performing a saturated area operation with a gate-source voltage equal to or less than threshold voltages of the load transistor M12 and the load-side supporting bias transistor M02 (claim 8).

Thus, by using the common-gate transistor M13 and the common-gate supporting bias transistor M03 whose threshold voltages are low, it becomes possible to make the bias voltages of the bias circuits 21c and 22c in FIG. 4 the same, as shown in a principle (5) of the present invention in FIGS. 5A and 5B, to share the bias voltage of the bias circuit 21d among the transistors M12 and M13, and to omit the bias circuit 22c.

Namely, the basic bias circuit 21d may be used for the load-side common-gate bias circuit 22c (claim 9).

From FIG. 5A, it is found that the condition of the saturated operation in the transistor M02 is given by the following equation (29). From Eq.(29), the equation (30) can be led, where $V_{DS02}$, $V_{GS02}$, $V_{T02}$, $V_{GS03}$ are respectively the drain-source voltage, the gate-source voltage, and the threshold voltage of the transistor M02, and the gate-source voltage of the transistor M03.

$$V_{DS02} = V_{GS02} - V_{GS03} \geq V_{GS02} - V_{T02} \qquad \text{Eq.(29)}$$

$$V_{T02} \geq V_{GS03} \qquad \text{Eq.(30)}$$

FIG. 5B shows a relationship between the threshold voltage $V_{T03}$ of the above-mentioned common-gate transistor M03 and the threshold voltage $V_{T02}$ of the load-side supporting bias transistor M02.

When an enhancement-mode transistor M02 operates with a drain current $I_D = I_1$ in the saturated area, the gate-drain voltage $V_{GS02}$ and the threshold voltage $V_{T02}$ have a mutual relationship shown in FIG. 5B. From the above Eq.(30), the gate-source voltage $V_{GS03}$ of the transistor M03 has to be on the left side where the gate-source voltage $V_{GS03}$ is smaller than the threshold voltage $V_{T02}$.

In case the threshold voltage $V_{T03}$ of the transistor M03 is negative, that is a depletion-mode transistor, the drain current=$I_1$ can be flowed with the gate-source voltage being $V_{GS03}$.

When the gate-source voltage $V_{GS}$ is assumed to be the same as the threshold voltage $V_{T02}$, a transistor MXX having a characteristic shown by a dashed line can also flow the drain current=$I_1$. Since the threshold voltage $V_{TXX}$ of the transistor MXX is positive, the transistor MXX is the enhancement-mode transistor. However, it has a lower threshold voltage than the transistor M02.

Similarly, in case the transistor M02 is the depletion-mode transistor, the threshold voltage of the depletion-mode transistor M03 can be determined.

Also, in the present invention, as shown in a principle (6) of the present invention in FIG. 6B, a substrate (bulk) and a source of the load transistor M12 and the load-side supporting bias transistor M02 may be short-circuited (claim 10).

FIGS. 6A–6D show a principle (6) of the present invention, in which FIG. 6A is the same as FIG. 1. Although being not shown in FIG. 6A, bulk terminals of the n-channel transistors M11, M12, M01, and M02 are connected to a node T whose potential is the lowest. Also, the bulk terminals of the p-channel transistors are connected to a node (not shown) whose potential is the highest.

In these cases, occasionally the potential of the source terminal is different from that of the bulk terminal. As mentioned above, the relationship between the drain current $I_D$ and the gate-source voltage $V_{GS}$ in the saturated area of the MOS transistor has been expressed by Eq.(22).

However, since the channel through which the drain current $I_D$ flows is an area sandwiched between the gate and the bulk, the drain current $I_D$ is influenced not only by the gate-source potential difference $V_{GS}$ but also by a source-bulk potential difference $V_{SB}$.

Namely, even if the potential difference $V_{GS}$ does not change, a threshold voltage $V_T$ related to a channel formation changes as the potential difference $V_{SB}$ changes. The threshold voltage $V_T$ in consideration of the potential difference $V_{SB}$ can be expressed by the following equation (31):

$$V_T = V_{T0} + \gamma(\sqrt{2\Phi_f + V_{SB}} + ee - \sqrt{+e}, \text{rad}2\Phi_f) \qquad \text{Eq.(31)}$$

where $V_{T0}$ is the threshold voltage $V_T$ when $V_{SB}$=0, $\gamma$ is a constant determined depending on a process, and $\phi_f$ indicates a fermi level.

Eq.(31) indicates a substrate bias effect in which the threshold voltage $V_T$ changes as the $V_{SB}$ changes.

FIG. 6C shows an influence of the substrate bias effect in FIG. 6A. The dot-dash line in FIG. 6C indicates the source voltage ($V_B - V_{GS12}$) of the transistor M12 when the connection between the source and the bulk of the transistor M12 is short-circuited ($V_{SB}$=0), while the solid line indicates the source voltage ($V_B - V_{GS12}$) in case the bulk terminal of the transistor M12 is connected to the node T (source of the transistor M11, see FIG. 6A) whose potential is the lowest.

It is seen from FIG. 6C that $V_{GS12}$ increases as the threshold voltage $V_T$ of the load transistor M12 increases due to the substrate bias effect, a possibility of shortage of the power supply voltage arises, and that the gain $A_1$ (gradient of the solid line) decreases.

The solid line in FIG. 6D is the same as the dot-dash line in FIG. 6C. It is found that by the short-circuit between the source and the bulk of the transistor M12, the shortage of the power supply voltage caused by the substrate bias effect does not occur and the gain $A_1$ does not decrease.

Also, in the present invention, an amplifying circuit may comprise 2N−1 basic amplifiers, where N is a natural number, connected in cascade, a feedback resistor connected between an input terminal of a first stage of the basic amplifiers and an output terminal of a last stage of the basic amplifiers, and the basic bias circuit (claim 11).

Namely, an odd number of basic amplifiers are connected in cascade to compose an inversion amplifying circuit, and a negative feedback is effected to the inversion amplifying circuit by the feedback resistor, thereby enabling an amplifying circuit for supplying a bias voltage by the basic bias circuit to be composed. Thus, the amplifying circuit having a stable gain and a cutoff frequency can be realized.

Also, an optical device may be connected to the input terminal of the amplifying circuit (claim 12). Namely, it is possible to amplify a current signal inputted from the optical device.

Also, the basic bias circuit may be commonly used for the basic amplifiers (claim 13). Thus, it becomes possible to decrease the number of the basic bias circuits.

Also, the present invention may further comprise an input bias circuit composed of a series circuit of a drive-side supporting transistor having a gate-drain short-circuited for outputting a bias voltage, from a drain, provided to a gate of the drive transistor M11, and a load-side supporting transistor whose gate is connected to a bias voltage of the basic bias circuit 21 (claim 14).

Thus, an input operation point of the drive transistor M11 is determined by the input bias circuit, and the amplifier 11 can be used as an amplifying circuit of an open loop.

Furthermore, in the present invention, the drive and the load transistors may be integrated on a same substrate with only a channel width being different (claim 15).

BRIEF DESCRIPTION OF THE DRAWINGS

FIGS. 2A and 2B are circuit diagrams showing a principle (2) of an amplifying circuit according to the present invention;

FIGS. 5A and 5B are circuit diagrams showing a principle (5) of an amplifying circuit according to the present invention;

Throughout the figures, like reference numerals indicate like or corresponding components.

DESCRIPTION OF THE EMBODIMENTS

Embodiment (1)

Figure 1:
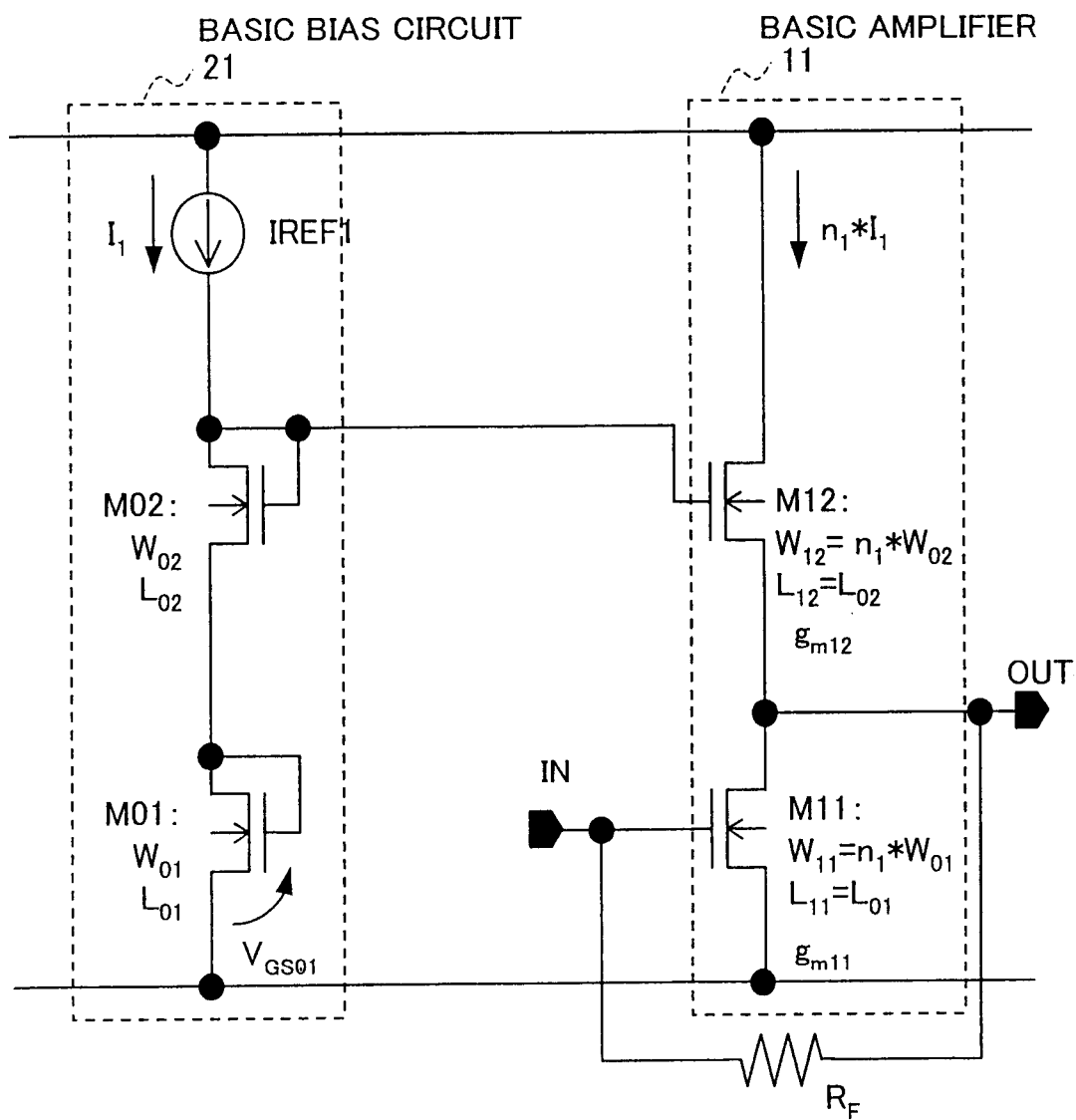
FIG. 1 is a circuit diagram showing a principle (1) of an amplifying circuit according to the present invention.
Figure 2A:
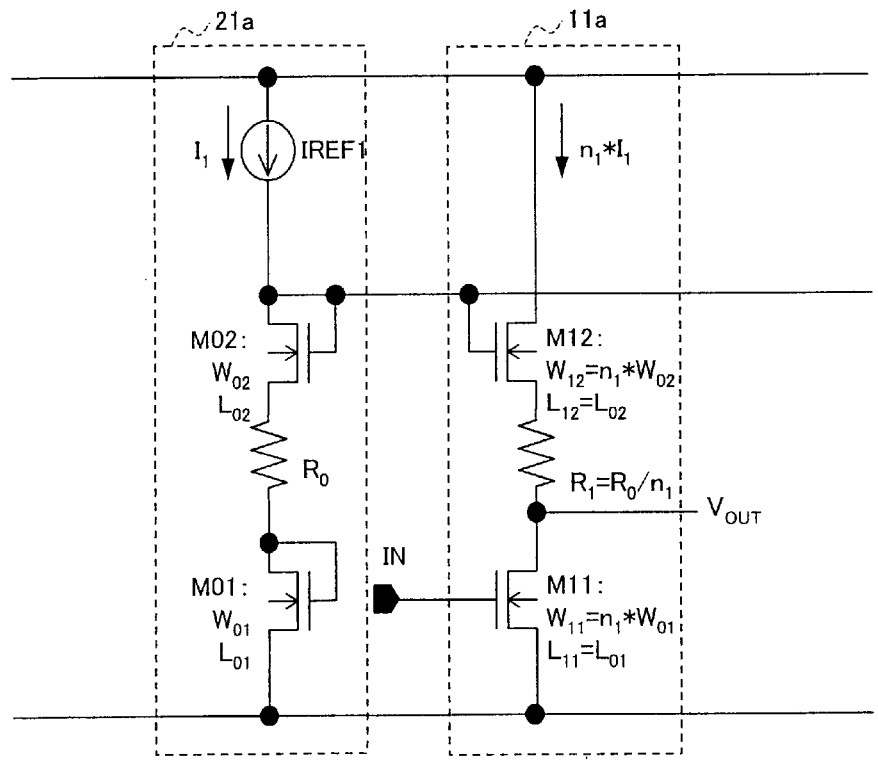
Figure 2A:
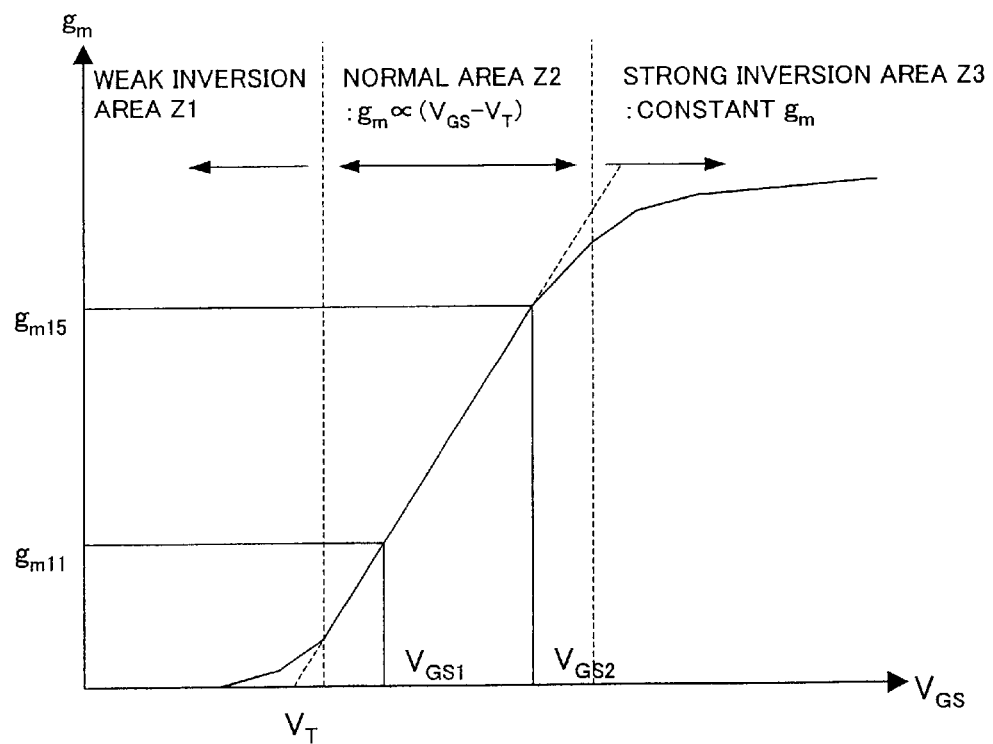
Figure 3:
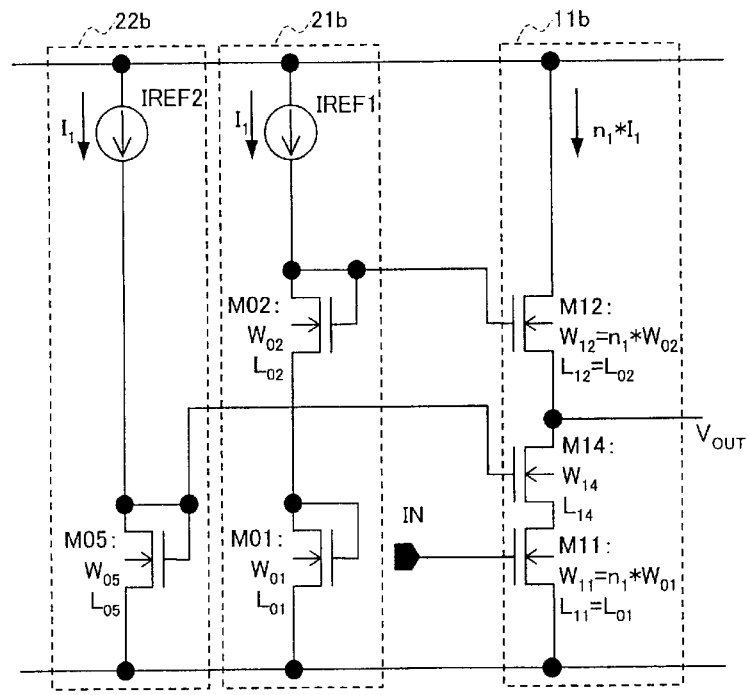
FIG. 3 is a circuit diagram showing a principle (3) of an amplifying circuit according to the present invention.
Figure 4:
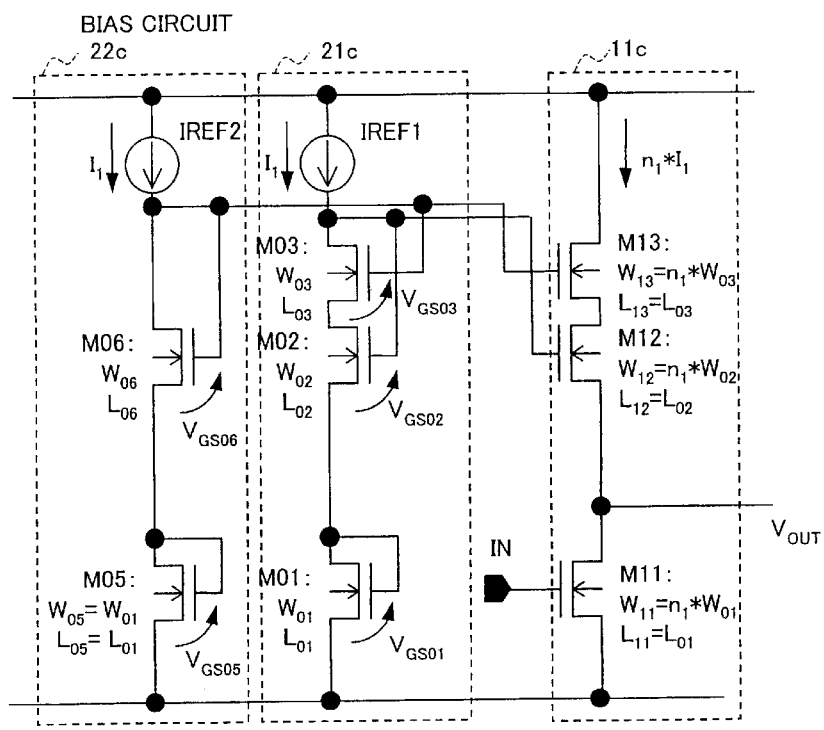
FIG. 4 is a circuit diagram showing a principle (4) of an amplifying circuit according to the present invention.
Figure 5A:
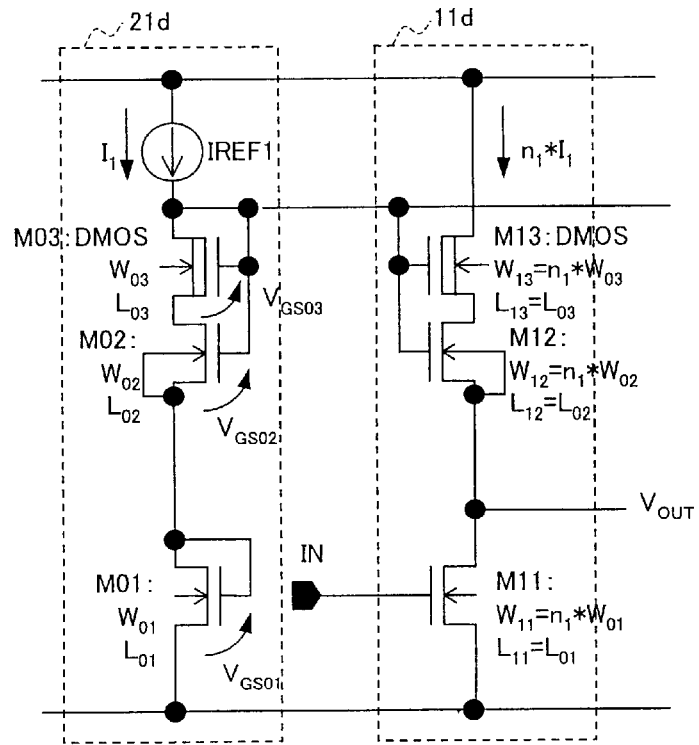
Figure 5A:
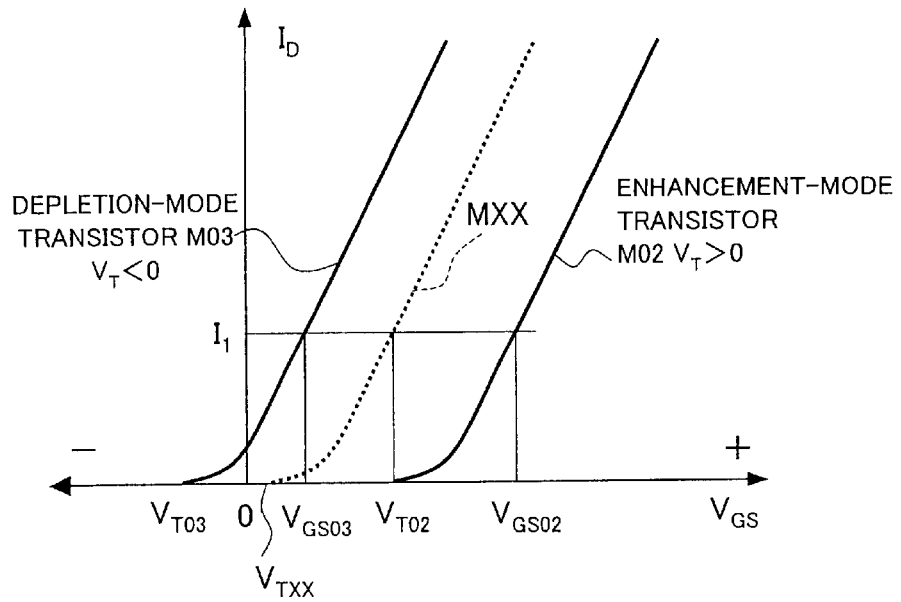
Figure 6A:
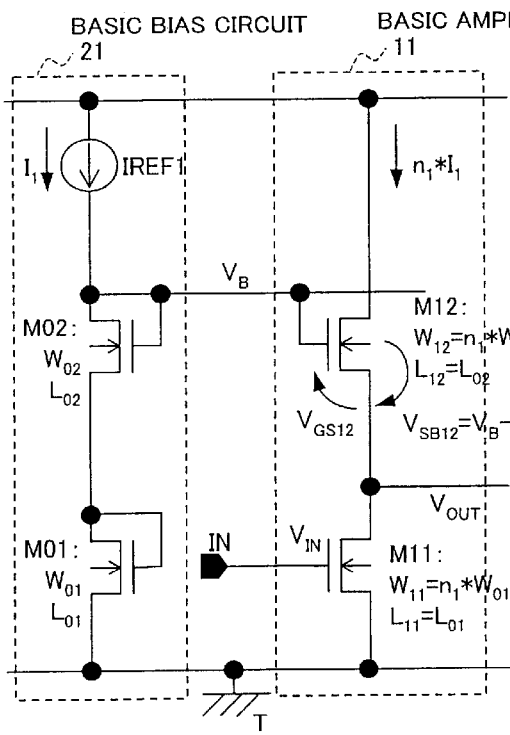
FIGS. 6A–6D are circuit diagrams showing a principle (6) of an amplifying circuit according to the present invention.
Figure 6B:
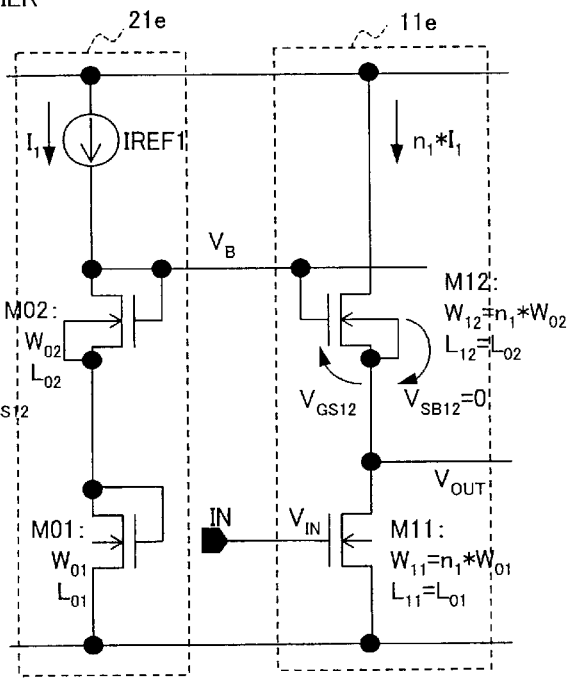
Figure 6C:
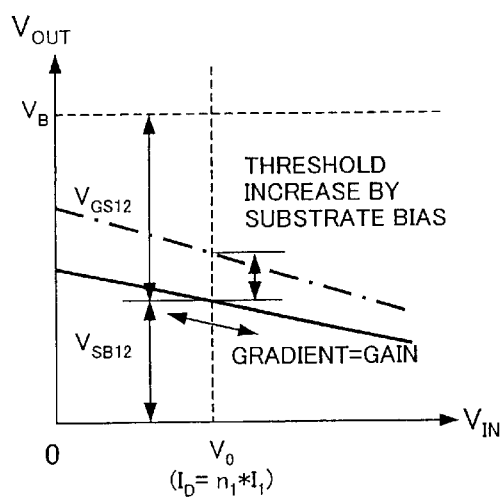
Figure 6D:
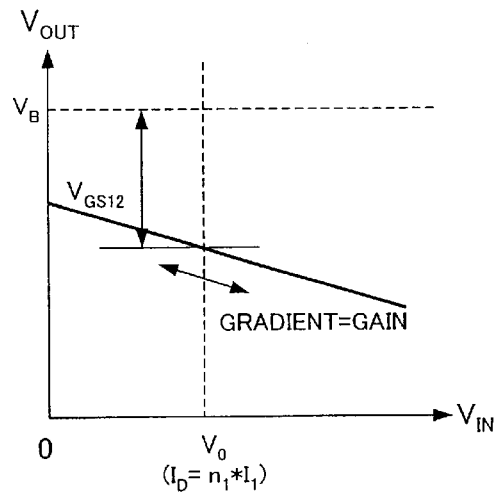
Figure 7:
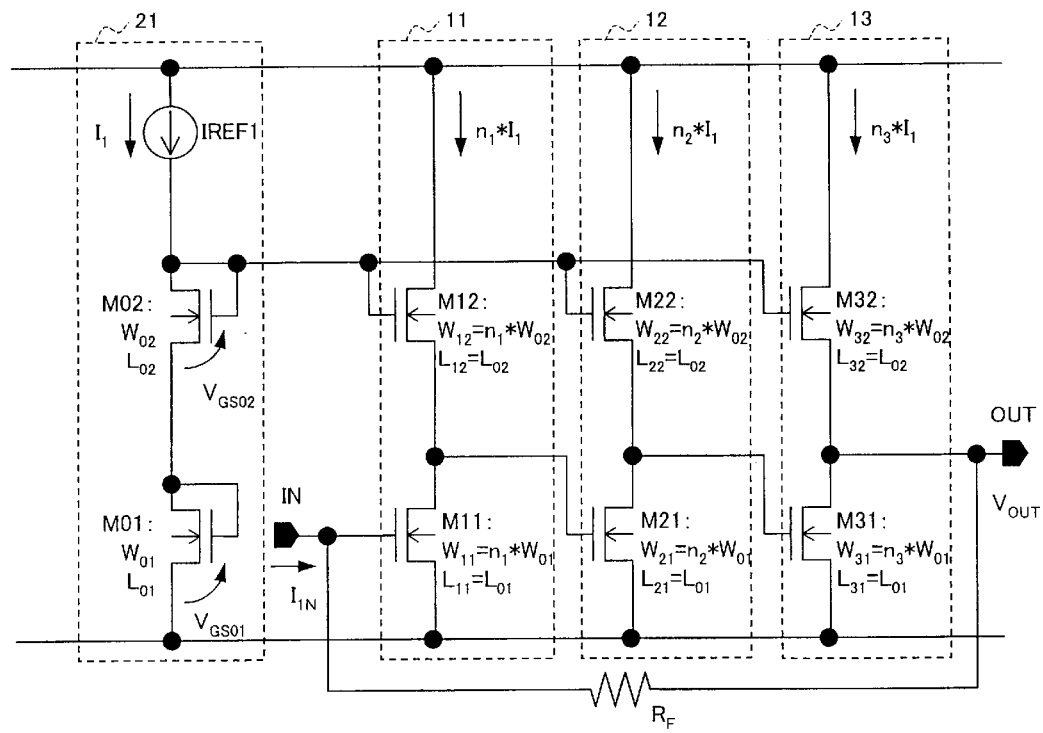
FIG. 7 is a circuit diagram showing an embodiment (1) of an amplifying circuit according to the present invention.

FIG. 7 shows an embodiment (1) of an amplifying circuit 100 according to the present invention. This amplifying circuit 100 is a trans-impedance type preamplifying circuit, which comprises a basic bias circuit 21, an inversion amplifying circuit composed of three-staged basic amplifiers 11, 12, 13, and a feedback resistor $R_F$ connected between an input terminal IN and an output terminal OUT.

The bias circuit 21 is composed of transistors M01 and M02 having a gate-drain short-circuited, and a reference current source IREF1 which are connected in series. The inversion amplifying circuit is composed of load transistors M12, M22 and M32 whose gates are connected to that of the transistor M02 in the bias circuit 21, and drive transistors M1, M21, and M31.

Current/voltage conversion of e.g. a faint current signal $I_{IN}$ inputted from a photo diode PD is performed by the feedback resistor $R_F$ of the preamplifying circuit 100, so that the converted signal is outputted as a voltage signal $V_{OUT}$. At this time, by a negative feedback, the gate voltages and drain voltages of the drive transistors M1, M21, and M31 are almost equal to the gate-drain voltage of the bias transistor M01.

The channel lengths $L_{11}$, $L_{21}$, $L_{31}$ of the transistors M11, M21, M31 are set to be the same channel length $L_{01}$ of the transistor M01. The channel lengths $L_{12}$, $L_{22}$, $L_{32}$ of the transistors M12, M22, M32 are set to be the same channel length $L_{02}$ of the transistor M02. Channel widths $W_{11}$, $W_{21}$, $W_{31}$ of the transistors M11, M21, M31 are set to be $n_1$, $n_2$, $n_3$×the channel width $W_{01}$ of the transistor M01. Channel widths $W_{12}$, $W_{22}$, $W_{32}$ of the transistors M12, M22, M32 are set to be $n_1$, $n_2$, $n_3$×the channel width $W_{02}$ of the transistor M02.

In such a setting, the bias currents of the amplifiers 11, 12, and 13 at each stage respectively assume current values $n_1*I_1$, $n_2*I_1$, and $n_3*I_1$, that are constant×the reference current $I_1$.

If Eq.(19) is applied, the gains $A_1$, $A_2$, and $A_3$ of the amplifiers 11, 12, and 13 respectively assume roots of $(W_{11}/W_{12})$, $(W_{21}/W_{22})$, and $(W_{31}/W_{32})$. The open loop gain A of the preamplifying circuit assumes a root of $(W_{11}*W_{21}*W_{31})/(W_{12}*W_{22}*W_{32})$, which is determined only by the shape ratio of a transistor $(W_{11}*W_{21}*W_{31})/(W_{12}*W_{22}*W_{32})$ independent of the process condition or the temperature variation, thereby enabling the stable gain characteristic to be realized.

In case the faint current signal $I_{IN}$ inputted from the photo diode PD is also inputted to the preamplifying circuit 100 for example, and the input capacitance is assumed to be $C_{IN}$, the close loop bandwidth is held by the above-mentioned Eq. (16) determined only by the stable gain A, the feedback resistor $R_F$, and the input capacitance $C_{IN}$.

Embodiment (2)

Figure 8:
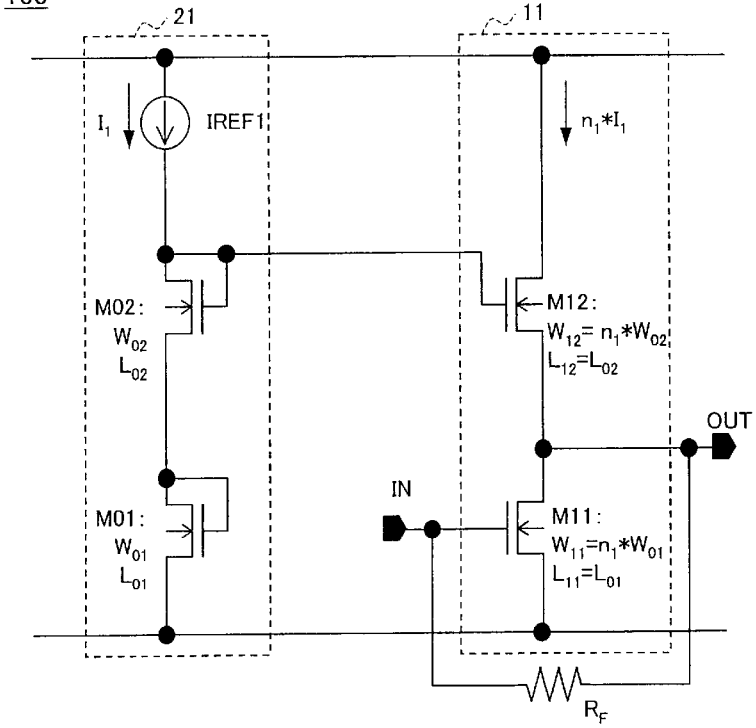
FIG. 8 is a circuit diagram showing an embodiment (2) of an amplifying circuit according to the present invention.

FIG. 8 shows an embodiment (2) of the present invention. This amplifying circuit 100 is also the trans-impedance type preamplifying circuit. However, this is different from the amplifying circuit 100 of the embodiment (1) in that the inversion amplifying circuit is only composed of a single-staged basic amplifier 11. Generally, it is possible to connect amplifiers of arbitrary odd number stages such as five stages and seven stages to compose the inversion amplifying circuit. Thus, by composing the inversion amplifying circuit by connecting amplifiers of arbitrary odd number stages, the open loop gain can be arbitrarily designed.

Embodiment (3)

Figure 9:
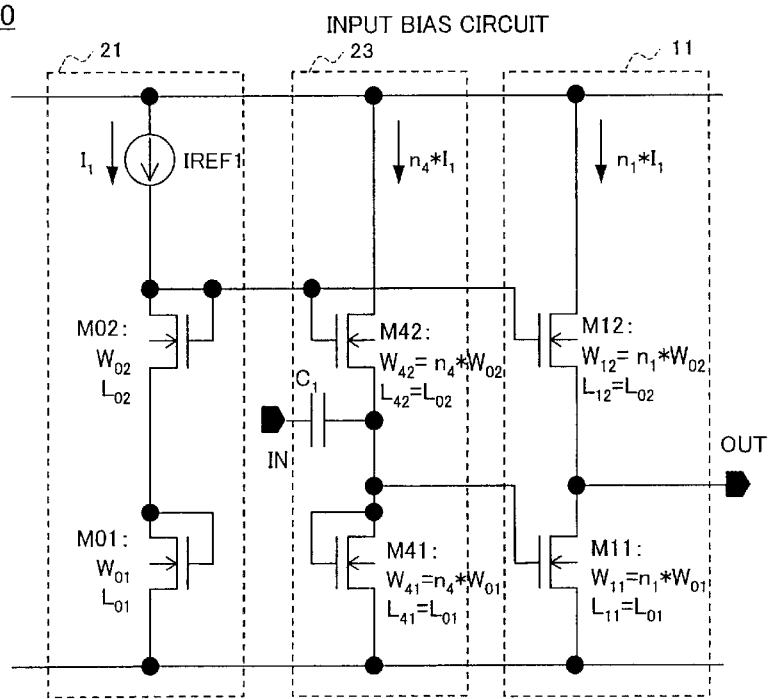
FIG. 9 is a circuit diagram showing an embodiment (3) of an amplifying circuit according to the present invention.

FIG. 9 shows an embodiment (3) of an amplifying circuit 100 according to the present invention. This amplifying circuit 100 is a capacitance-coupled amplifying circuit, where the gate voltage of the drive transistor M11 is set almost equal to the gate-drain bias voltage of a drive-side supporting transistor M41 by an input bias circuit 23 for determining the input operation point, and almost the same operation condition as the case where the negative feedback is effected can be satisfied. Therefore, it is possible to make an amplification with the stable gain $A_1$ following the above-mentioned Eq.(19).

Also, as shown in the embodiment (2), it is possible to connect multi-staged basic amplifiers 11 in cascade. In this case, the number of stages may be an even number. Thus, the present invention is effective for an amplifying circuit of an open loop.

Embodiment (4)

Figure 10:
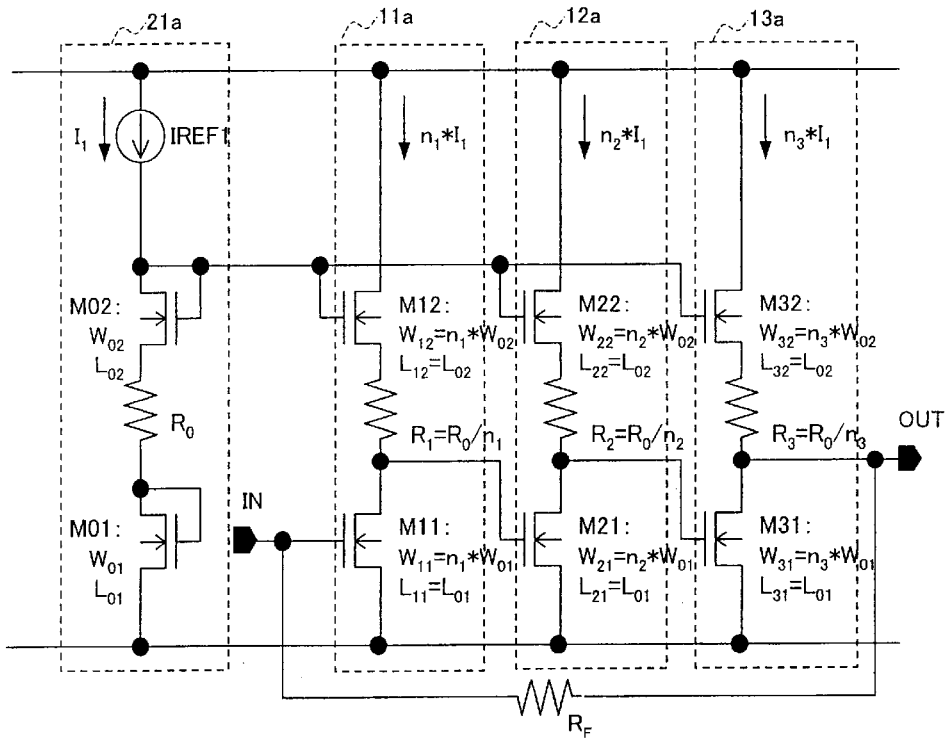
FIG. 10 is a circuit diagram showing an embodiment (4) of an amplifying circuit according to the present invention.

FIG. 10 shows an embodiment (4) of an amplifying circuit 100 according to the present invention. This amplifying circuit 100 is a trans-impedance type preamplifying circuit.

This embodiment (4) is different from the embodiment (1) shown in FIG. 7 in that load resistors $R_1$, $R_2$, and $R_3$ are respectively connected between the drive transistors M11, M21, M31 and the load transistors M12, M22, and M32. Thus, it becomes possible to eliminate a transconductance saturation of the load transistors M12, M22, and M32, and to increase the gains of basic amplifiers 11a, 12a, and 13a.

Embodiment (5)

Figure 11:
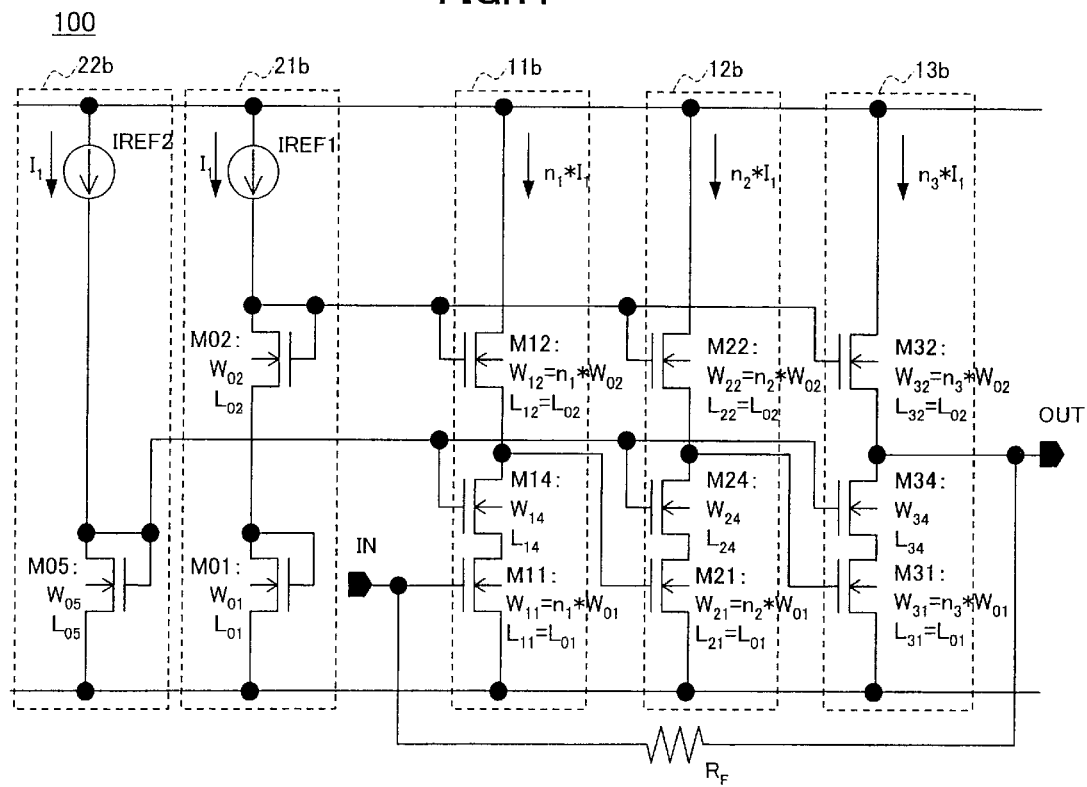
FIG. 11 is a circuit diagram showing an embodiment (5) of an amplifying circuit according to the present invention.

FIG. 11 shows an embodiment (5) of an amplifying circuit 100 according to the present invention. This amplifying circuit 100 is a trans-impedance type preamplifying circuit.

In the embodiment (5), drive-side common-gate transistors M14, M24, and M34 are respectively inserted into the drains of the drive transistors M11, M21, and M31. These transistors M14, M24, and M34 decrease the Miller effect which shows the gate capacitance larger due to the gate-drain capacitances of the drive transistors M11, M21, and M31, thereby decreasing the Miller capacitance.

Thus, the bandwidths of basic amplifiers 11b, 12b, and 13b are widened, and the bandwidth of the preamplifier is widened.

In order to generate a higher voltage than the bias voltage of the drive transistor, the transistor M05 of the bias circuit 22b which provides the bias voltage to the gate of the drive-side common-gate transistor should be rendered such that (the channel width $W_{O5}$ of the transistor M05)=(the channel width $W_{11}$ of the transistor M11)/4, when the sizes of e.g. the transistors M11 and M14 are equal.

Embodiment (6)

Figure 12:
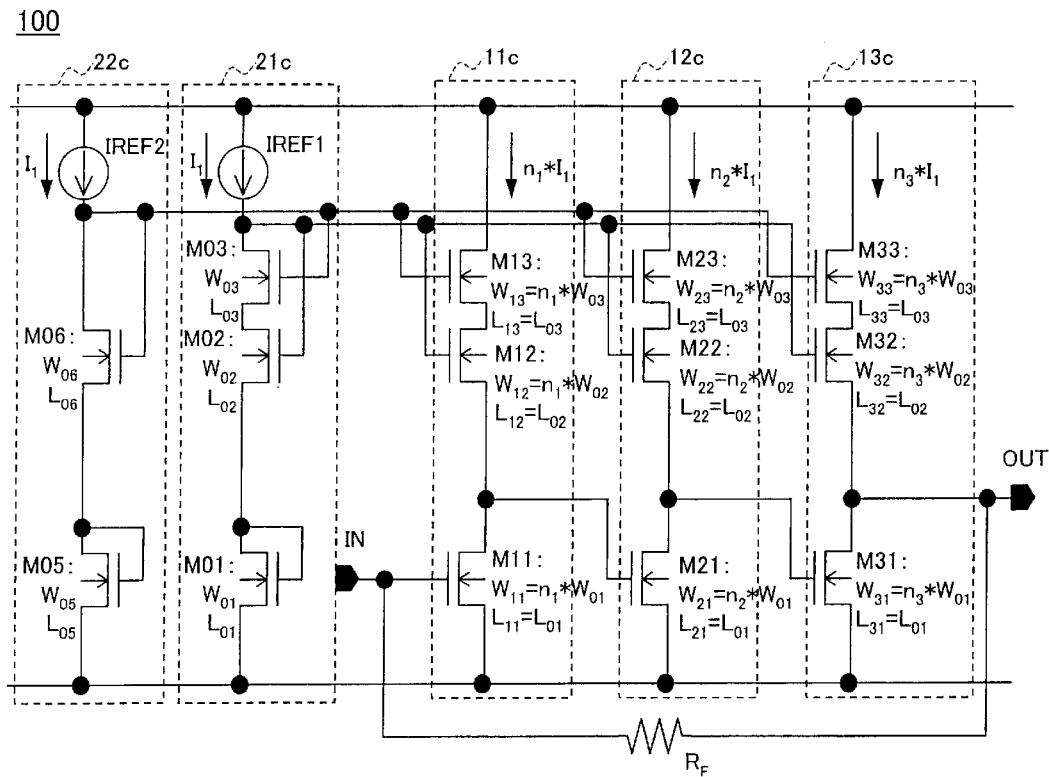
FIG. 12 is a circuit diagram showing an embodiment (6) of an amplifying circuit according to the present invention.

FIG. 12 shows an embodiment (6) of an amplifying circuit 100 according to the present invention. This amplifying circuit 100 is a trans-impedance type preamplifying circuit.

This embodiment (6) is different from the embodiment (1) shown in FIG. 7 in that load-side common-gate transistors M13, M23, and M33 are added between the drains of the load transistors M12, M22, and M32 and the power supply. Thus, a characteristic variation due to the power supply voltage variation is decreased, thereby realizing more stable gain characteristic.

It is to be noted that if the sizes of the transistors M02 and M03 are mutually equal, as mentioned above, the relationship between the channel widths and the channel lengths of the transistors M02 and M06 should be rendered as Eq.(28).

Embodiment (7)

Figure 13:
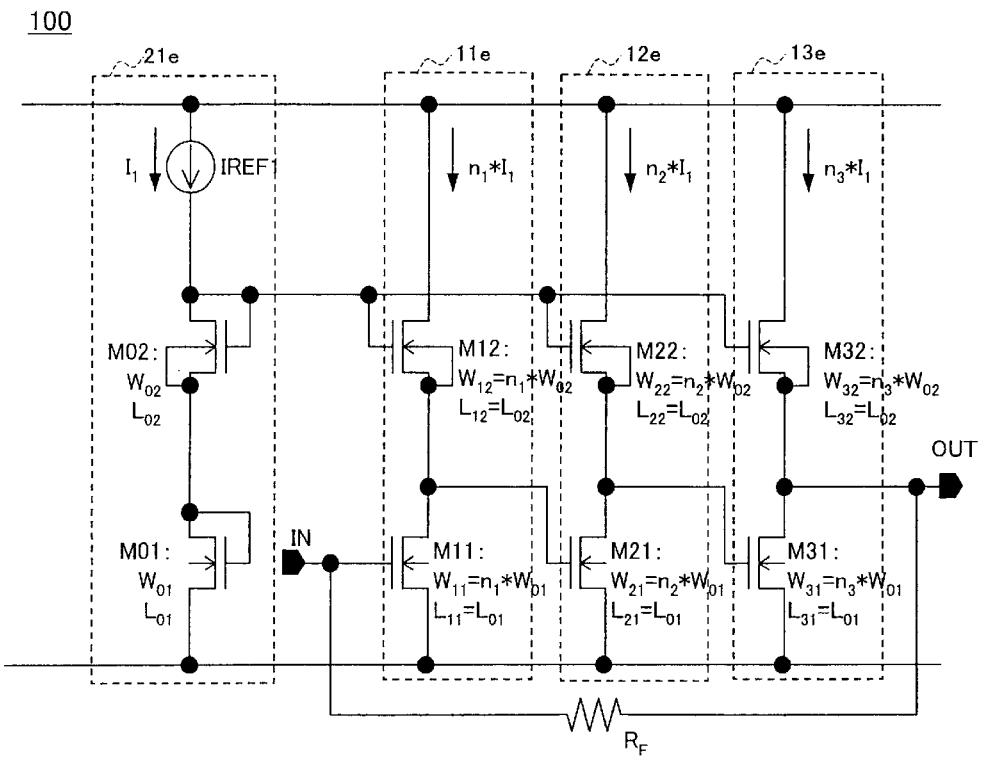
FIG. 13 is a circuit diagram showing an embodiment (7) of an amplifying circuit according to the present invention.

FIG. 13 shows an embodiment (7) of an amplifying circuit 100 according to the present invention. This amplifying circuit 100 is a trans-impedance type preamplifying circuit.

This embodiment (7) is different from the embodiment (1) shown in FIG. 7 in that the connection between the bulks and the sources of the load transistors M12, M22, and M32 is short-circuited. Thus, it becomes possible to eliminate the shortage of the power supply voltage and the decrease of the gain caused by the substrate bias effect of the load transistors M12, M22 and M32, and to improve the characteristic.

Embodiment (8)

Figure 14:
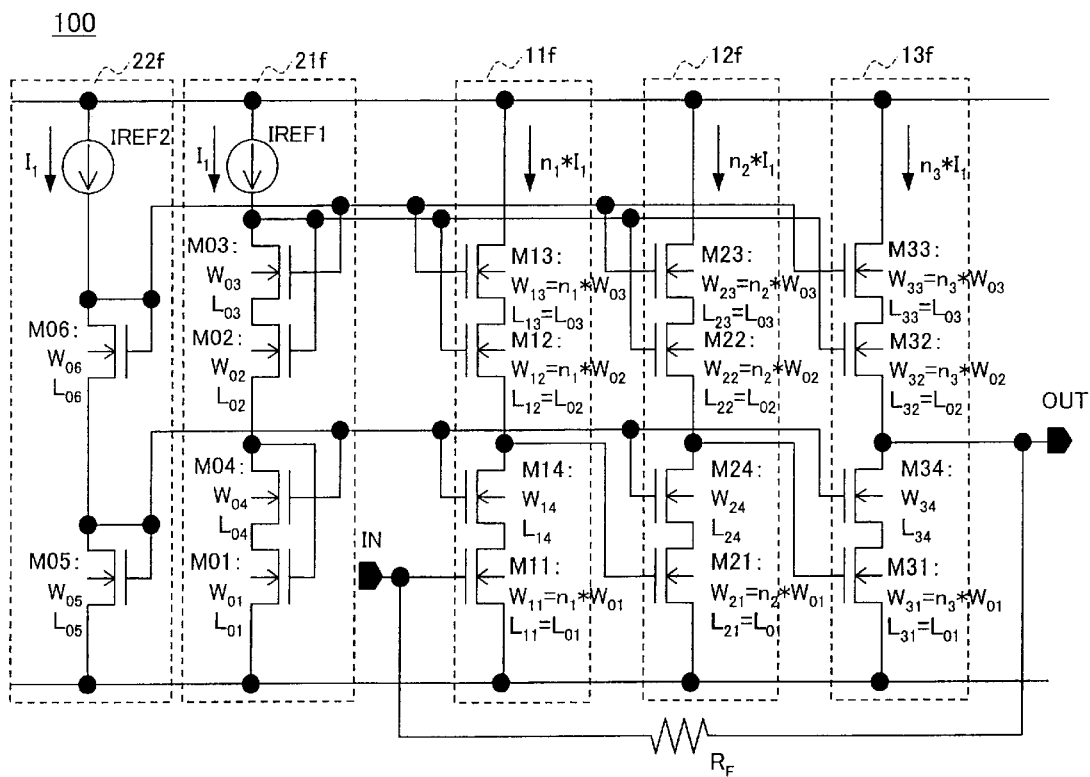
FIG. 14 is a circuit diagram showing an embodiment (8) of an amplifying circuit according to the present invention.

FIG. 14 shows an embodiment (8) of an amplifying circuit 100 according to the present invention. This amplifying circuit 100 is a trans-impedance type preamplifying circuit.

This embodiment (8) is a combination of the embodiments (5) and (6), where the common-gate transistors M14, M24, and M34 are inserted into the drains of the drive transistors M11, M21, and M31 in order to achieve the broad bandwidth of the amplifying circuit, and common-gate transistors M13, M23, and M33 are inserted into the drains of the load transistors M12, M22, and M32, so that the characteristic variation caused by the power supply voltage variation is decreased.

Embodiment (9)

Figure 15:
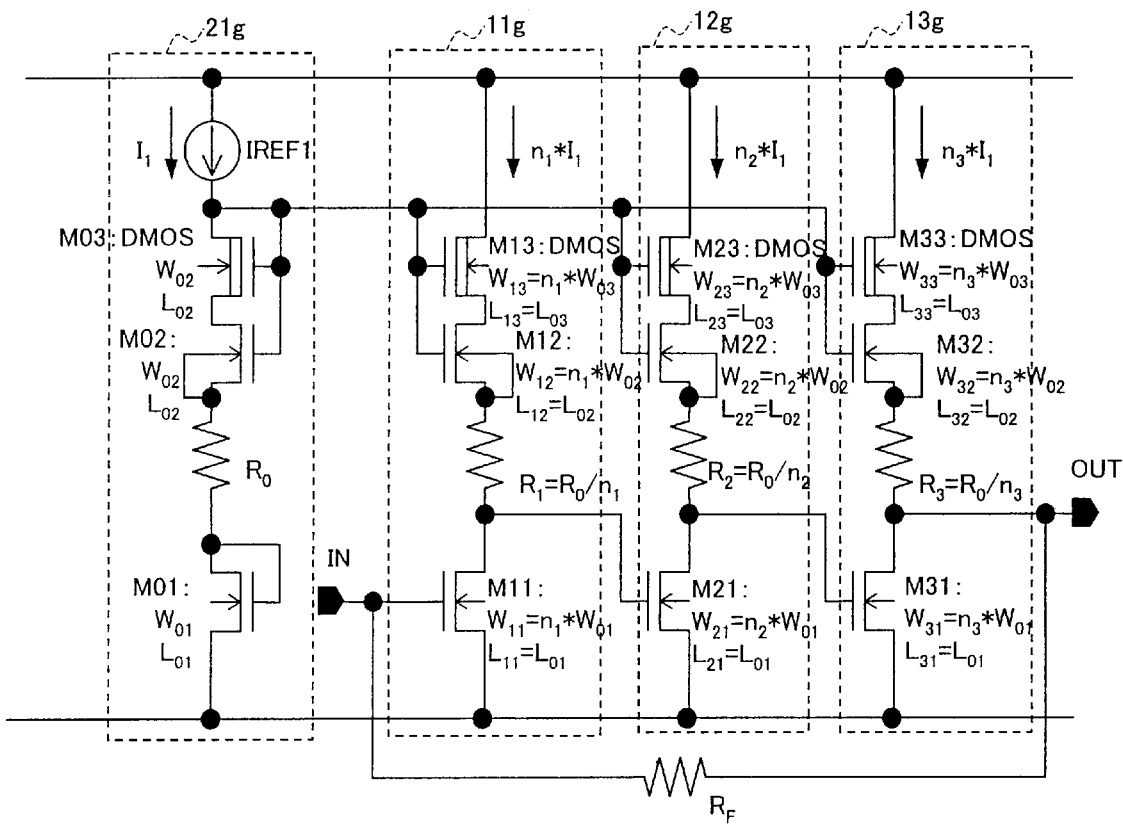
FIG. 15 is a circuit diagram showing an embodiment (9) of an amplifying circuit according to the present invention.

FIG. 15 shows an embodiment (9) of an amplifying circuit 100 according to the present invention. This amplifying circuit 100 is a trans-impedance type preamplifying circuit.

In this embodiment (9), in the same way as the embodiment (4), the load resistors $R_1$, $R_2$, and $R_3$ are inserted between the drive transistors M11, M21, and M31 and the load transistors M12, M22, and M32, thereby improving the gain.

Also, it is the same as the embodiment (6) in that the load-side common-gate transistors M13, M23, and M33 are inserted into the drains of the load transistors M12, M22, M32 in the embodiment (9), while the depletion-mode MOS (DMOS) is used for the transistors M13, M23, and M33. Thus, it becomes possible to omit the bias circuit 22c of the embodiment (6), resulting in a simplified arrangement of the bias circuit.

Embodiment (10)

Figure 16:
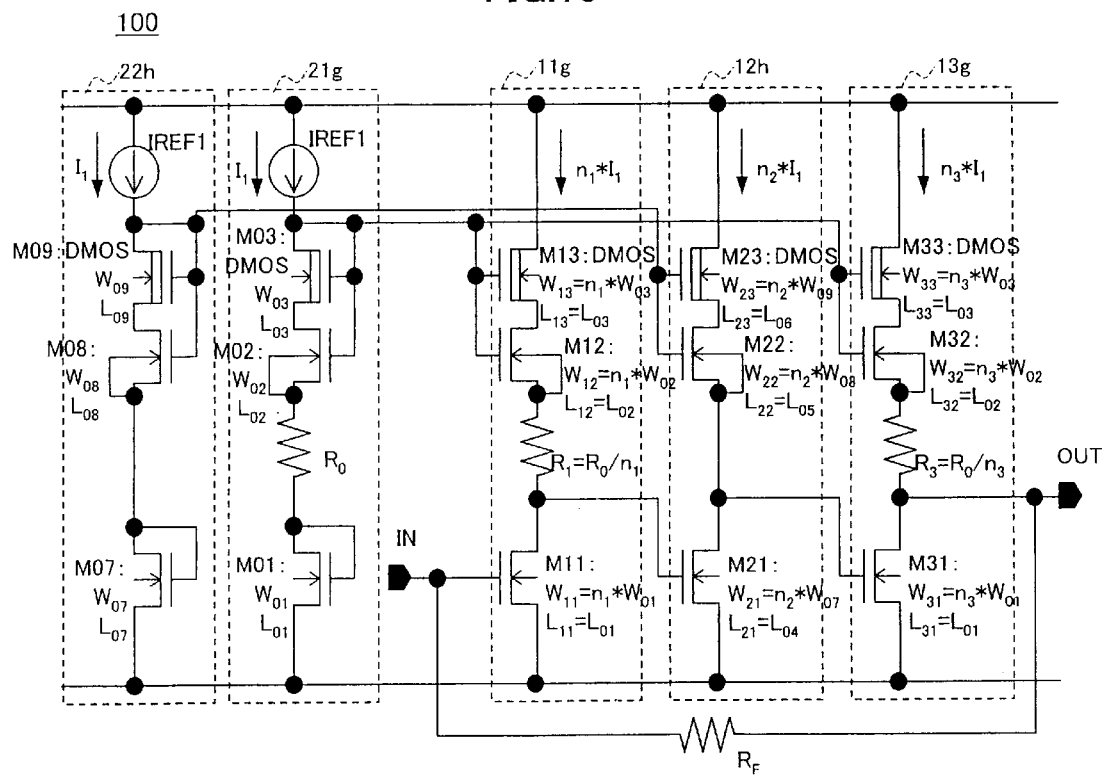
FIG. 16 is a circuit diagram showing an embodiment (10) of an amplifying circuit according to the present invention.

FIG. 16 shows an embodiment (10) of the amplifying circuit 100 according to the present invention, which shows a modification of the embodiment (9). This embodiment (10) is different from the embodiment (9) in that the load resistor $R_2$ is not inserted into the amplifier 12 but a bias circuit 22h for a basic amplifier 12h is added. Thus, in the amplifying circuit of the present invention, the gains of e.g. basic amplifiers 11g, 12h, and 13g at each stage can be flexibly designed.

Embodiment (11)

Figure 17:
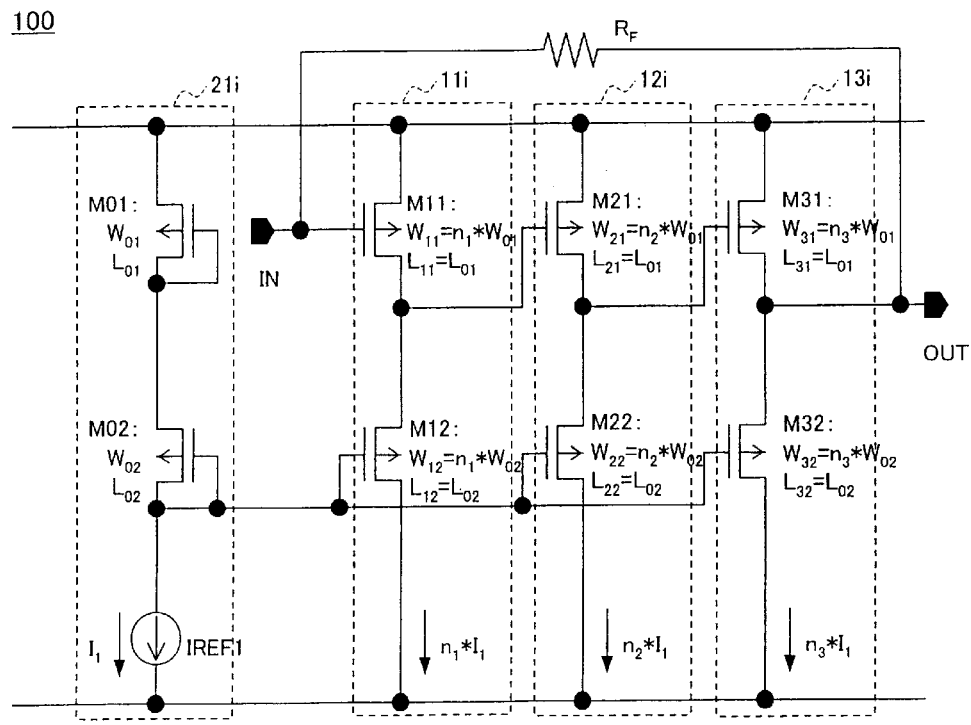
FIG. 17 is a circuit diagram showing an embodiment (11) of an amplifying circuit according to the present invention.
Figure 18:
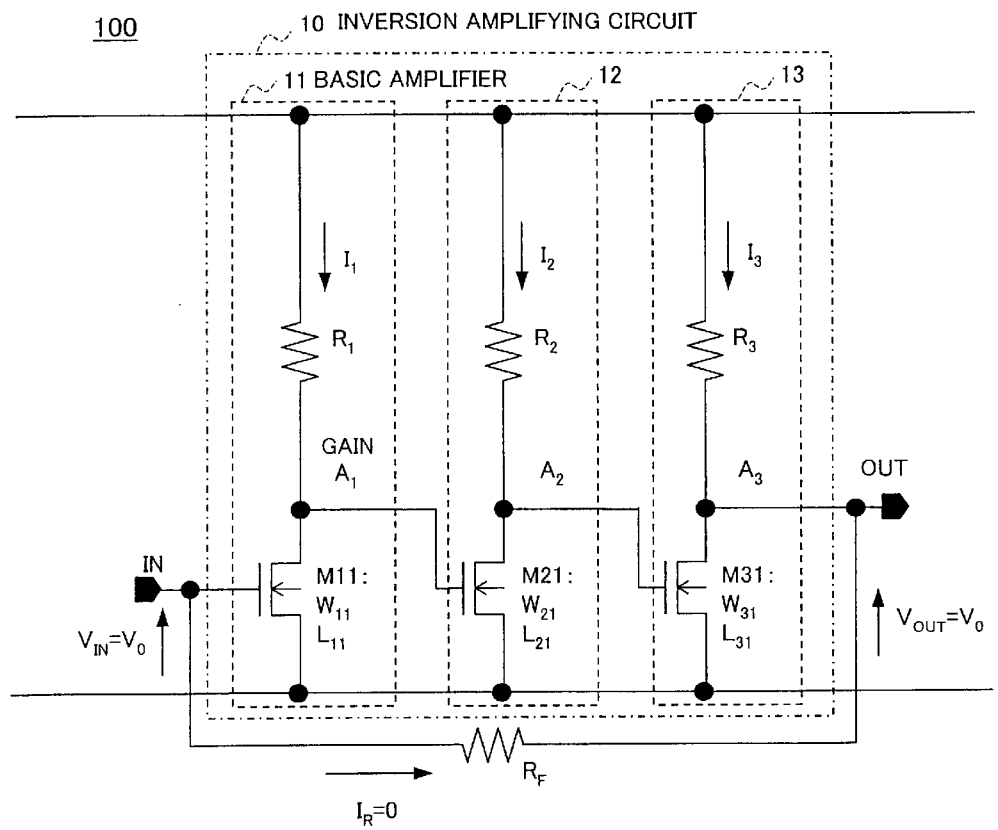
FIG. 18 is a circuit diagram showing an arrangement of a prior art amplifying circuit.
Figure 19:
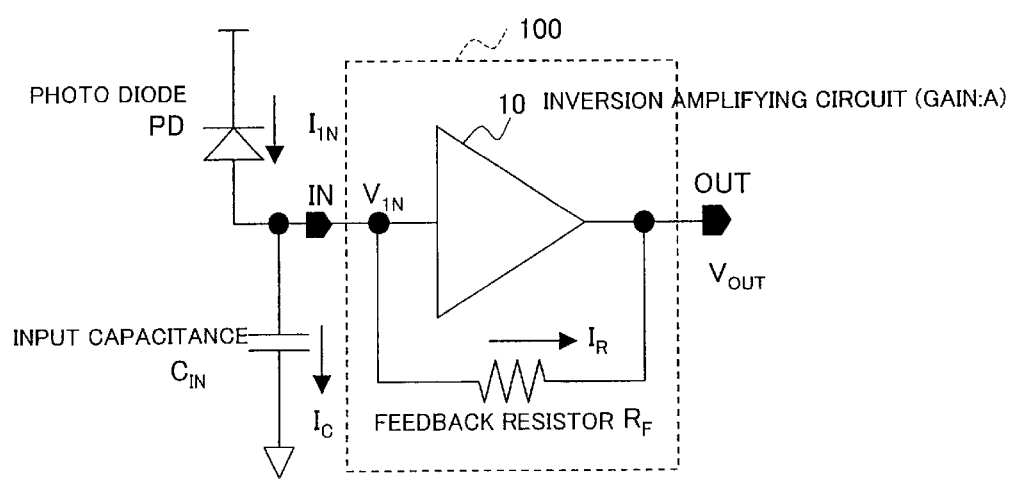
FIG. 19 is a circuit diagram showing an arrangement of a preamplifying circuit for a light reception by using a prior art amplifying circuit.

FIG. 17 shows an embodiment (11) of the amplifying circuit 100 according to the present invention. In this embodiment (11), the amplifying circuit composed of N-channel MOS transistors shown in the embodiment (1) is composed of P-channel MOS transistors. Thus, the amplifying circuit of the present invention can be composed of the P-channel MOS transistors. For example, the amplifying circuits of the above-mentioned embodiments (2)–(10) can be composed of the P-channel MOS transistors.

As described above, an amplifying circuit according to the present invention is arranged such that a drive transistor drives a load transistor, and a reference current source biases a drive-side and a load-side supporting bias transistors with a constant current for generating a bias voltage of the load transistor. Therefore, the drive transistor and the load transistor are integrated on the same substrate with only channel widths being different, thereby enabling a stable amplifying gain independent of variations of process condition and temperature to be easily realized.

Also, a load resistor or a drive-side common-gate transistor is inserted between the drive transistor and the load transistor, thereby enabling the gain of the amplifying circuit to be improved or a frequency bandwidth to be widened by suppressing an input capacitance increased due to Miller effect.

Also, a load-side common-gate transistor is inserted between the load transistor and a power supply, thereby enabling an influence of a power supply voltage variation for the load transistor to be decreased.

Also, the bulks and sources of the load transistor and the load-side supporting bias transistor are short-circuited, thereby enabling a possibility of occurrence of a power supply shortage to be suppressed.

Also, an amplifying circuit is composed of e.g. one or more odd number of basic amplifiers connected in cascade, and an output signal of the amplifying circuit is fed back to an input side with a feedback resistor, thereby enabling an amplifying circuit having a stable gain and cutoff frequency to be realized.

What we claim is:

1. An amplifying circuit comprising:
    an amplifier including a drive transistor and a load transistor driven by the drive transistor;
    a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a constant current; and
    a load resistor inserted between the drive and the load transistors, and a bias resistor inserted between the drive-side and the load-side supporting bias transistors.

2. The amplifying circuit as claimed in claim 1 wherein the drive and the load transistors are integrated on: a same substrate with only a channel width being different.

3. An amplifying circuit comprising:
    an amplifier including a drive transistor and a load transistor driven by the drive transistor;
    a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a constant current; and
    a drive-side common-gate transistor inserted between the drive and the load transistors, and a drive-side common-gate bias circuit for providing a bias voltage to a gate of the drive-side common-gate transistor.

4. The amplifying circuit as claimed in claim 3 wherein the drive-side common-gate bias circuit has a bias transistor having a gate-drain short-circuited for outputting the bias voltage from a drain, and a reference current source for biasing the bias transistor with a constant current.

5. The amplifying circuit as claimed in claim 3 wherein the drive and the load transistors are integrated on a same substrate with only a channel width being different.

6. An amplifying circuit comprising:
    an amplifier including a drive transistor and a load transistor driven by the drive transistor;
    a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a constant current; and
    a load-side common-gate transistor connected between the load transistor and a power supply, and a load-side common-gate bias circuit for providing a bias voltage to a gate of the load-side common-gate transistor.

7. The amplifying circuit as claimed in claim 6 wherein the load-side common-gate bias circuit is composed of a series circuit of a drive-side supporting bias transistor having a gate-drain short-circuited, a load-side supporting bias transistor having a gate-drain short-circuited for outputting the bias voltage from a drain, and a reference current source for biasing the drive-side and the load-side supporting bias transistors with a constant current.

8. The amplifying circuit as claimed in claim 7 wherein the bias circuit has a common-gate supporting bias transistor inserted between the load-side supporting bias transistor and the reference current source within its own circuit, and which inputs the bias voltage of the load-side common-gate bias circuit to a gate.

9. The amplifying circuit as claimed in claim 8 wherein the common-gate transistors of the amplifier and the bias circuit respectively have threshold voltages for performing a saturated area operation with a gate-source voltage equal to or less than threshold voltages of the load transistor and the load-side supporting bias transistor.

10. The amplifying circuit as claimed in claim 4 wherein the bias circuit is used for the load-side common-gate bias circuit.

11. The amplifying circuit as claimed in claim 6 wherein the drive and the load transistors are integrated on a same substrate with only a channel width being different.

12. An amplifying circuit comprising:

an amplifier including a drive transistor and a load transistor driven by the drive transistor; and a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a constant current, wherein a substrate (bulk) and a source of the load transistor and the load-side supporting bias transistor are short-circuited.

13. The amplifying circuit as claimed in claim 12 wherein the drive and the load transistors are integrated on a same substrate with only a channel width being different.

14. An amplifying circuit comprising:

2N−1 amplifiers, where N is a natural number, connected in cascade, and each of which including a drive transistor and a load transistor driven by the drive transistor;

a feedback resistor connected between an input terminal of a first stage of the amplifiers and an output terminal of a last stage of the amplifiers; and a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a constant current.

15. The amplifying circuit as claimed in claim 14 wherein an optical device is connected to the input terminal.

16. The amplifying circuit as claimed in claim 14 wherein the bias circuit is commonly used for the amplifiers.

17. The amplifying circuit as claimed in claim 14 wherein the drive and the load transistors are integrated on a same substrate with only a channel width being different.

18. An amplifying circuit comprising:

an amplifier including a drive transistor and a load transistor driven by the drive transistor;

a bias circuit composed of a series circuit of a drive-side supporting bias transistor having a gate-drain short-circuited, a load-side supporting bias transistor having a gate-drain short-circuited for outputting a bias voltage of the load transistor from a drain, and a reference current source for biasing the drive-side and the load-side supporting bias transistors with a, constant current; and an input bias circuit composed of a series circuit of a drive-side supporting transistor having a gate-drain short-circuited for outputting a bias voltage, from a drain, provided to a gate of the drive transistor, and a load-side supporting transistor whose gate is connected to a bias voltage of the bias circuit.

19. The amplifying circuit as claimed in claim 18 wherein the drive and the load transistors are integrated on a same substrate with only a channel width being different.

* * * * *